US008001510B1

(12) United States Patent
Miller et al.

(10) Patent No.: US 8,001,510 B1
(45) Date of Patent: Aug. 16, 2011

(54) AUTOMATED METHOD OF ARCHITECTURE MAPPING SELECTION FROM CONSTRAINED HIGH LEVEL LANGUAGE DESCRIPTION VIA ELEMENT CHARACTERIZATION

(75) Inventors: Ian D. Miller, Charlotte, NC (US); Jorn W. Janneck, San Jose, CA (US); David B. Parlour, Fox Chapel, PA (US); Paul R. Schumacher, Berthoud, CO (US)

(73) Assignee: Xilinx, Inc., San Jose, CA (US)

(*) Notice: Subject to any disclaimer, the term of this patent is extended or adjusted under 35 U.S.C. 154(b) by 419 days.

(21) Appl. No.: 12/205,825

(22) Filed: Sep. 5, 2008

(51) Int. Cl.
*G06F 17/50* (2006.01)

(52) U.S. Cl. ........ 716/116; 716/102; 716/104; 716/105; 716/117; 716/124; 716/126

(58) Field of Classification Search .................... 716/55, 716/102, 104, 105, 116, 117, 124, 126, 139
See application file for complete search history.

(56) References Cited

U.S. PATENT DOCUMENTS

| | | | | |
|---|---|---|---|---|
| 6,044,453 | A * | 3/2000 | Paver | 712/201 |
| 6,775,808 | B1 * | 8/2004 | Raje et al. | 716/55 |
| 7,412,680 | B1 * | 8/2008 | Gouterman et al. | 716/126 |
| 7,500,216 | B1 * | 3/2009 | Blunno et al. | 716/104 |
| 7,519,938 | B1 * | 4/2009 | Shortt et al. | 716/104 |
| 7,647,441 | B2 * | 1/2010 | Wingard et al. | 710/105 |
| 7,725,856 | B1 * | 5/2010 | Govig et al. | 716/124 |
| 7,735,047 | B1 * | 6/2010 | Anderson et al. | 716/116 |

OTHER PUBLICATIONS

Prihozhy, A. et al., "Evaluation of the parallelization potential for efficient multimedia implementations: dynamic evaluation of algorithm critical path", Circuits and Systems for Video Technology, IEEE Transactions on , vol. 15, Issue 5, May 2005, 593-608 pgs.

Eker, J. et al., "CAL Language Report", Specification of the CA 1. actor language, language version 1.0—document edition 1, ERL Technical Memo UCB/ERL M03/48, University of California at Berkeley, Dec. 1, 2003, 1-128 pgs.

Bhattacharyya, S.S. et al., "Software Synthesis from Dataflow Graphs", Kluwer Academic Press, Norwell MA 1996 (Abstract).

U.S. Appl. No. 11/348,731, filed Feb. 6, 2006, Kulkarni, C. et al., Xilinx, Inc., 2100 Logic Drive, San Jose, CA 95124.

U.S. Appl. No. 11/243,679, filed Oct. 4, 2005, Janneck, J. et al., Xilinx, Inc., 2100 Logic Drive, San Jose, CA 95124.

U.S. Appl. No. 11/729,182, filed Mar. 27, 2007, Schumacher, P. et al., Xilinx, Inc., 2100 Logic Drive, San Jose, CA 95124.

U.S. Appl. No. 11/729,206, filed Mar. 27, 2007, Schumacher, P. et al., Xilinx, Inc., 2100 Logic Drive, San Jose, CA 95124.

(Continued)

*Primary Examiner* — Helen Rossoshek

(74) *Attorney, Agent, or Firm* — LeRoy D. Maunu; Thomas George

(57) ABSTRACT

Disclosure is made of approaches for mapping an electronic design specification to an implementation. In one approach, quality metrics are associated with functional units of the design, and the functional units are mapped to respective initial implementations. For each functional unit a respective quality indicator is determined based on the mapping. The quality indicator specifies a degree to which the functional unit achieves the associated quality metric. At least one of the functional units is selected for remapping based on the quality indicator of that functional unit or the quality indicator of another functional unit. An alternative implementation to the initial implementation is selected for each selected functional unit to improve the quality indicator. The selected functional unit is remapped to the selected alternative implementation.

18 Claims, 6 Drawing Sheets

OTHER PUBLICATIONS

U.S. Appl No. 11/076,798, filed Mar. 10, 2005, Turney, R, et al., Xilinx, Inc., 2100 Logic Drive, San Jose, CA 95124.

U.S. Appl. No. 11/076,797, filed Mar. 10, 2005, Schumacher, P. et al., Xilinx, Inc., 2100 Logic Drive, San Jose, CA 95124.

* cited by examiner 400
403 or 406
INT 411
BRL 413
or
DSPL 414
402
INT 411
CLE 412
404
INT 411
IOL 415
IOL 415
OTHER 408
I/O 407
CONFIG / CLOCK DISTRIBUTION 409
PROC 410
CONFIG / CLOCKS 405
MGTs 401
CLBs 402
BRAMs 403
IOBs 404
DSPs 406

AUTOMATED METHOD OF ARCHITECTURE MAPPING SELECTION FROM CONSTRAINED HIGH LEVEL LANGUAGE DESCRIPTION VIA ELEMENT CHARACTERIZATION

FIELD OF THE INVENTION

The present invention generally relates to implementing an electronic circuit design.

BACKGROUND

Programmable Logic Devices (PLDs) are Integrated Circuits (ICs) that are used to implement digital logic operations according to user configurable input. Example PLDs include Complex Programmable Logic Devices (CPLDs) and Field Programmable Gate Arrays (FPGAs). CPLDs often include several function blocks that are based on programmable logic array (PLA) architecture with sum-of-products logic. A configurable interconnect matrix transmits signals between the function blocks.

An example FPGA includes an array of configurable logic blocks (CLBs) and a ring or columns of programmable input/output blocks (IOBs). The CLBs and IOBs are interconnected by a programmable interconnect structure (routing resources). The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

SUMMARY OF THE INVENTION

The various embodiments of the invention provide automated mapping of a design to an implementation by considering alternative implementations for one or more of the functional units of the design. In one embodiment a method comprises associating a quality metric with one or more of the functional units. The method maps each functional unit to a respective initial implementation. For each functional unit based on the mapping, the method determines a respective quality indicator that specifies a degree to which the functional unit achieves the associated quality metric. At least one of the functional units is selected for remapping based on at least one of, the quality indicator of that functional unit or the quality indicator of another functional unit. The method also selects an alternative implementation to the initial implementation for each selected functional unit to improve the quality indicator. The alternative implementation is selected from at least one hardware-type implementation and at least one software-type implementation. The selected functional unit is remapped to the selected alternative implementation.

In another embodiment, an article of manufacture is provided. The article of manufacture comprises a processor-readable storage medium configured with instructions for mapping an electronic design specification to an implementation. The design specification includes a plurality of functional units and the processor in executing the instructions performs operations including associating a quality metric with one or more of the functional units. The operations include mapping each functional unit to a respective initial implementation. For each functional unit based on the mapping, the operations include determining a respective quality indicator that specifies a degree to which the functional unit achieves the associated quality metric. At least one of the functional units is selected for remapping based on at least one of, the quality indicator of that functional unit or the quality indicator of another functional unit. The operations also select an alternative implementation to the initial implementation for each selected functional unit to improve the quality indicator. The alternative implementation is selected from at least one hardware-type implementation and at least one software-type implementation. The selected functional unit is remapped to the selected alternative implementation.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1A:
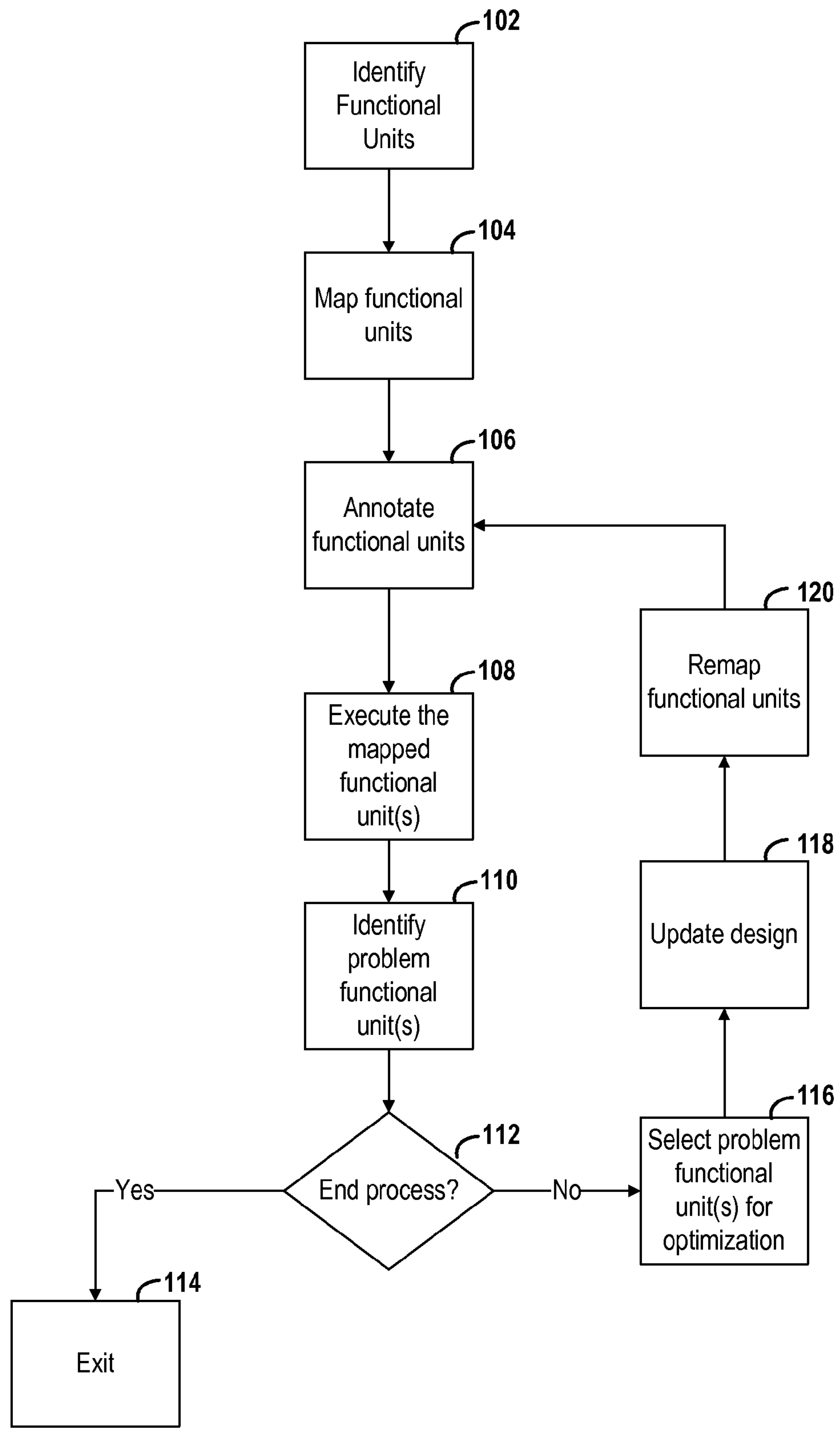
FIG. 1A shows a flow chart of a process for implementing a design in accordance with various embodiment of the invention.

A conventional design process for an integrated circuit, such as an ASIC or an FPGA begins with specification of the desired function which may be represented in a schematic diagram or captured using one or more hardware description languages (e.g., VHDL, ABEL or Verilog). The input design description is translated into a network of the primitive functional elements supported by the target integrated circuit device ("netlist") in an implementation step often referred to as synthesis and/or mapping. The primitive components of the netlist are then assigned to physical locations on the integrated circuit ("placement"). Interconnects (i.e., signal conductors) are routed within the target device for the placed components. Place-and-route procedures sometimes involve optimizations of a design's timing, power consumption, area and any combination thereof.

In addition to logic elements, many types of PLD devices provide processors in the library of primitive functional elements that can be targeted during synthesis. The processor resources may be implemented directly in silicon, or may themselves be collections of primitive logical elements. Some synthesis tools require the user to program components specifically for software or hardware implementation. Other synthesis tools partition the design between hardware and software in a process that is transparent to the user. These and other methods, however, are not without their problems. Efficient methods of partitioning between software and hardware may be advantageous. Methods of characterizing elements of a design and addressing their impact on quality may be advantageous. A flexible design format that is user-friendly while providing a level of user control over the synthesis of the design would also be beneficial.

The embodiments of the present invention provide various approaches for mapping functional units of an electronic design specification to an implementation. With one approach, a quality metric is associated with one or more of the functional units. A quality metric specifies an objective to be achieved by the implemented functional units, such as throughput, area, concurrency level as well as other objectives described below. The functional units of the design are mapped to respective initial implementations. The implementations may include strictly hardware components, strictly software components to be executed on a processor, or a combination of both hardware and software components. Based on the mappings to the implementations, respective quality indicators are determined. Each quality factor indicates the degree to which the functional unit as mapped to the implementation achieves the associated quality metric. Based on the quality factors, at least one of the functional units is selected for remapping. The selection may be based on either the quality indicator of that functional unit or the quality indicator of another one of the functional units. For each selected functional unit, an alternative implementation to the initial implementation is selected to achieve the quality metric. For example, a hardware implementation may be selected for one or more functional units initially implemented in software, or a functional unit may be split and implemented part in hardware and part in software. Each alternative implementation is selected from at least one hardware-type implementation and at least one software-type implementation. The selected functional unit is then remapped to the selected alternative implementation.

Other embodiments of the invention have the design functionality specified as a dataflow system in which functional units (actors) communicate data (tokens) via first-in-first-out channels (queues). A functional unit may contain a set of one or more user-defined operations (actions). The operations may be responsive to an input queue and may generate data for an output queue. Queues supply status indications to the functional units, indicating empty and full conditions to the functional units with which they are associated. A queue has both a head, from which data is retrieved, and a tail, into which data is placed. A queue is simultaneously an input queue, from the perspective of the consuming functional unit, and an output queue from the perspective of the generating functional unit. A functional unit pushes data into a connected output queue and reads data from a connected input queue. A functional unit which is responsive to an input queue is said to be input starved if that input queue contains an insufficient number of tokens (e.g., may be empty) and all other conditions for that functional unit to advance execution are satisfied. A functional unit which generates data for an output queue is said to be output blocked if there is insufficient capacity in the output queue to store the set of generated data. The output blocked condition may be temporary, being alleviated when a second functional unit retrieves one or more tokens from the head of the queue. In a dataflow system further execution of a functional unit is stalled until any generated tokens are stored in the appropriate output queue. This ability for a queue to stall a producing functional unit is termed backpressure.

Of particular use in analyzing an implementation of a dataflow system is an execution trace. This trace is a log of operations performed by the functional units within the dataflow system during simulation or execution with a particular data set. It may capture token consumption and production as well as data related to functional unit execution. For example, in the case of a functional unit described in the CAL actor language ("CAL Language Report," Ecker and Janneck. Electronics Research Lab, Department of Electrical and Computer Sciences, University of California at Berkeley Calif.), the execution trace may capture the particular executed action and the action selection criteria. Additionally, the execution trace is annotated with time data that indicates the times at which the operations were performed. Time data may be in various units and may specify absolute time (e.g., wall-clock time) or relative time (e.g., basic sequence). An execution trace, annotated with time data, resulting from simulation of the design may be used to identify functional units whose individual performance limits overall performance of the system, or conversely functional units whose individual performance exceeds the level needed to meet overall performance requirements. These identified functional units may be optimized in a manner that improves performance or reduces implementation cost. The optimization of these units may include switching their implementation from hardware to software running on a processor resource, or vice versa. Note that while examples presented may describe particular embodiments, such as embodiments including a PLD, the disclosed techniques and structures may be applied, in general, to any system having processor resources, including systems having one or more ICs, for instance ICs which may be partially programmable or configurable, or system on chip (SoC).

Behavior of functional units may be specified, for example, using the CAL programming language, network language (NL), or a combination of the two or other similar languages. One embodiment of the present invention integrates a design written in the CAL programming language and NL into a PLD. The use of the CAL programming language allows for explicit and simple definitions of the functional units by the programmer. The use of NL allows hierarchical compositions of functional units to be specified. The present invention is not limited, however, to any specific programming language. Other embodiments integrate designs written using other languages including, but not limited to, XML, VHDL, Verilog, C, C++, JAVA and ABEL.

FIG. 1A shows a flowchart of a process for implementing a design in accordance with various embodiment of the invention. At step 102, the design is parsed by identifying functional units. In some instances, such as the CAL programming language and network description languages, the functional units may be inherently identified by the programming language. In other instances, the functional units are otherwise identified. In a more particular example, the programmer can explicitly identify the functional units using some predetermined flag that indicates the bounds of each functional unit to the mapping software. In another example, the identification of the functional units may be hidden from the programmer. This can be accomplished by having the software mapping tool create one or more functional units by applying well known graph clustering algorithm(s) (e.g., minimum-cut or maximum flow) in order to group related operations and minimize the number of inter group queues. In another instance, the mapping tool can identify the functional units using both explicit and hidden methods.

At step 104, the functional units are mapped to respective implementations. For example, the functional units may be mapped to resources of a PLD using a mapping tool to determine how the functional units can be implemented within the PLD. Those skilled in the art will recognize various tools for mapping the design specification of the functional units to the chosen target implementation(s). The mapping tools involved will vary according to the source design specification and the target implementation. For a PLD implementation of the design, the resulting model contains possible implementations of the functional units within the PLD constraints. Depending on the capabilities of the PLD, the initial implementations may include only hardware, only software (to be executed on processor resources of the PLD), or a combination of both hardware and software. The mapping tool may determine how to implement the design using a number of different criteria. For instance, the mapping tool may optimize the mapping for maximum throughput, to minimize hardware area consumed, to minimize power, to minimize processing capacity used, or to minimize the processor instruction store. The particular metric of quality for a system implementation may vary depending on the end purpose for that system. For example, in embedded applications small size or low power may be of primary concern to a designer, whereas in a high performance computing application overall data throughput may be the goal. One method of conceptualizing the optimization choices of the mapping tool is to view different implementations as corresponding to different priority or stepped levels of optimization. Based on default values or user specification of the metric for quality an optimization series is assembled, where increasing optimization level in the series generally corresponds to increased quality based on the specified metric. For instance, for the goal of improved throughput (tokens processed per unit time) the optimization series (from lower level to higher) may be compilation to single processor software, compilation to multiprocessor software, functional unit decomposition with partial compilation to hardware, and compilation of full functional unit to hardware. In another example, the metric for quality may be minimal resource usage. In this example the optimization level series may be full hardware implementation, mixed hardware/software implementation, multi processor, and single processor implementation. It will be appreciated that there may be a quality metric that is associated with all the functional units, such as to minimize hardware area consumed, or some functional units may have their own respective quality metrics, such as maximizing throughput.

At step 106, annotations related to the metric of quality are added to the mapped model. For example, when token throughput is the goal, timing information may be added. This information describes the expected execution time of the actions for each functional unit. In one embodiment the timing information is obtained from an estimation process, in which the execution time of operations within a functional unit are estimated according to predetermined values. In an alternative embodiment the timing information is obtained from detailed simulation of a full implementation of the functional unit (e.g., hardware description language simulation for a hardware implementation or instruction set simulation for software implementations as provided in step 108). In another alternative embodiment the timing information can be retrieved from a stored speed file and associated with the mapped model.

At step 108, the model is executed. In one embodiment of the invention, the execution is accomplished by simulating the functionality of the PLD and the model using a software tool. Such a simulation can be run using user-provided input parameters, random input parameters and/or predetermined patterns. The simulation can be run a single time or multiple times. Likewise, the length of the simulation can vary depending upon a variety of factors including, but not limited to, the complexity of the design, user input and time constraints on the simulation length.

During the execution of the model a time-annotated execution trace is stored for subsequent analysis. This may be accomplished through instrumentation of the simulator or through insertion of monitoring facilities within an executing system. In either case, the activity of the dataflow system is monitored for limitations on functional unit execution (e.g., starvation of inputs and blocked outputs), time elapsed, and when functional units are actively executing. This monitoring may take the form of an execution trace from which the relevant data is extracted.

At step 110, a set of problem functional units according to the quality metric is identified. In one embodiment this can be accomplished by recording which functional units were output blocked during the simulation along with the time of the output block condition. A specific example of an output blocked function is a functional unit that cannot perform an action due to an output queue without sufficient capacity to store a set of generated tokens. In such an example, the functional unit is effectively blocked from performing additional processing due to this backpressure. It is also possible to identify problem functional units from those that have less than completely full output queues. For example, during simulation functional units could be marked as nominally output blocked, by way of storing information in the execution trace, upon reaching a threshold amount of data in their output queues. In another example, functional units could be marked as nominally output blocked based upon an average amount of data contained within their output queues. In a particular instance, the process of identifying problem functional units involves tracing through the data flow to find the underlying cause of the output block. A particular example of such a tracing procedure is discussed in more detail in FIG. 1B. In the case where the metric for quality is minimal resource usage, problem functional units may be identified through the execution trace as those for which token throughput exceeds a user specified target. The relevant data in the execution trace for identifying a functional unit having too great a throughput may include respective times at which tokens are output by the functional unit, In another instance, when the quality metric is total-consumed resources, the process of identifying problem functional units involves calculating a total resource count from the annotated data for each functional unit. In this case, identification of a problem functional unit may involve determining those units where the total resource count exceeds some threshold. Alternatively, the determination may weigh the resource count against token throughput or other heuristic. In other embodiments the metric may be power, memory usage, or other metric for which appropriate calculations may be performed in the identification of problem functional units.

At step 112, a determination is made as to whether the process should end. If the determination is to end the process, the process exits at step 114. Otherwise the process continues to 116. Any number of factors can be used in the determination of step 112. A few examples include, but are not limited to, all of the design constraints having been met, exhaustion of enabled optimization levels, a set number of iterations having been performed, a run-time limit being exceeded, user input and a number of iterations where little or no appreciable improvement has been achieved.

At step 116, the process attempts to improve the quality, as measured according to the specified metric, by selecting one or more of the identified problem functional units from step

110 to optimize. The selection of problem functional units may be governed by a priority assigned to each. Functional units may be prioritized according to their import in meeting the design constraints as well as their potential impact on overall system quality. For example, data from the time-annotated execution trace (generated in step 108) may be used to determine the cumulative time that each functional unit was output blocked. This value may be used as an indication of the severity of throughput limitation on the system and as such can be used in setting the optimization priority of the functional unit. For example, one functional unit having a greater time being output blocked will have a higher priority than another functional unit having a lesser time being output blocked.

In addition to the cumulative blocked time an estimation of the improvement to the unit's quality that is likely from increased optimization of the unit may be used in assigning an optimization priority to a problematic functional unit. For example, when the implementation of a functional unit is to be changed to or from a hardware implementation a concurrency factor may be estimated. This may be based on analysis of the operations which make up the functional unit and their dependencies. This factor is an indication of expected change in throughput based on the change to implementation. The calculation of this factor is further described below. In another example, the design (or a user) may indicate which paths and/or functional units are critical (or not critical) to the application. In another example, a functional unit with excessive throughput may be prioritized according to the percentage of excess throughput. As discussed above, such optimization may be conceptualized as a change in the priority or optimization level of the functional unit. By changing the optimization level, the functional unit can be implemented in a corresponding manner so as to improve the quality of the implementation. For example in a system where token throughput is the quality metric, increased optimization level will attempt to mediate any output blocking of the functional units that depend from the problem functional unit. In another example a system where resource count is the metric will attempt to decrease the resource count in response to an increased optimization level.

In one embodiment of the invention, the concurrency factor can be generated for each functional unit by programmatically processing a representation of the operations, data and control flow of a functional unit. This may be done on a control data flow graph, static single assignment, abstract syntax tree, or other form as is well known in the art. Based on the type of implementation, each operation, data flow and control flow is assigned an estimated latency and interdependencies are annotated to the representation. An analysis is performed to calculate the minimum and maximum latency and initiation interval for the functionality in order to generate an estimate of the throughput of the particular implementation. Conditional branches of execution are handled by calculating the worst case latency. Iterative structures are factored in as if executing a single iteration. Alternative embodiments may modify the calculation of this concurrency factor through (though not limited to) heuristically weighting each branch of a conditional branch, weighting iterative structures based on calculated or estimated numbers of iterations, applying heuristics for contended resources (e.g., memories). Alternatively, a concurrency factor may be found by generating the hardware implementation and using standard simulation and static analysis techniques to determine the actual token consumption and production rates. There are a wide range of alternative methodologies for calculating a concurrency metric. One such example is the use of instrumented software source code to calculate concurrency metrics from an execution using live test data. Other mechanisms are similarly possible, and useful within the context of this invention. Regardless of the methodology used to obtain a concurrency factor, the factor can be presented to the user and/or used within the compiler decision making process as a factor in the determination of the disposition of a particular functional unit.

In a particular embodiment of the invention, a determination of the disposition of a functional unit (e.g., between hardware and/or software) is made by determining the balance of available hardware resources, available processor cycles, and quality (e.g., ultimate data throughput rate) desired by the user for the functional unit. In a specific instance, the compiler automatically makes this determination. In another instance, the user is presented with a variety of information on the design, such as the concurrency factor, resource count, or the expected performance of various functional units in each implementation technology, and the user is responsible for the partitioning.

At step 118, a new (or updated) model is generated using the functional units selected at step 116. In response to a modified optimization level, certain functional units may be modified. This may include structural modifications to the functional unit such as decomposition, duplication of functionality (e.g., loop unrolling), factoring out of common functionality or other structural transformations. Similarly the functional unit may be merged with other functional units. The selection of applied transformations is governed by the optimization specified by the selected optimization level. It should be noted that these transformations are used as examples and other software and logic (circuit) transformation techniques may be applied.

According to one embodiment of the invention, in response to a change in optimization level, a functional unit may be further decomposed into multiple functional units. In some instances this process is made trivial by the compositional nature of the particular functional unit. For example, a functional unit specified as a network of functional units may be decomposed into the contained functional units. In the case where the composition contains multiple levels of hierarchy the decomposition may be to a specified depth in the hierarchy (e.g., depth of 1) or complete decomposition to the leaf (non-hierarchical) elements. In a second example, functional units which are not hierarchical (e.g., CAL actors) may also be decomposed. Language elements, such as CAL actions may be used for grouping of operations to comprise one functional unit of the decomposition. Additionally, implicit features of the functional unit, such as the action scheduling logic may be grouped as a functional unit of the decomposition. In another example, graph analysis, as discussed in step 102, may be used to create one or more functional units of the decomposition. In all methods of decomposition the data and control dependencies which cross between the newly created functional units are noted. Queues are inserted into the representation to manage the communication of tokens accordingly. It should be appreciated that there are many ways in which decomposition of a functional unit to multiple functional units can be performed. The examples given here are intended to illustrate, it should be noted that other techniques are possible. Regardless of the method of decomposition, the mapping software is now able to independently vary the optimization level for each functional unit of the decomposition.

According to one embodiment of the invention a functional unit may be compiled to software running on a single processor resource of the system. This compilation step may be achieved through translation of the functional unit source description to a traditional software language (e.g., C) with appropriate low level routines for managing token input and token output. This software representation is then compiled to suitable binary representation for the given processor. In an alternative embodiment the functional unit source may be directly translated to the appropriate binary format.

According to another embodiment of the invention, multiple functional units may be compiled to the same processor resource. In one embodiment the functional units are each translated to software code which describes a thread to be run within a multi-threaded execution environment on the processor. Those queues which connect these co-located functional units may be implemented as memory objects, protected with standard thread-safety techniques. In yet another embodiment the behavior of each functional unit is combined into a single thread of execution with sufficient management functionality to ensure adequate processing cycles for each. Any number of scheduling algorithms well known in the art may be used.

The process then proceeds to step 120, where the model is re-mapped as in step 104 and is updated for any changes in timing or other annotated parameters.

Figure 1B:
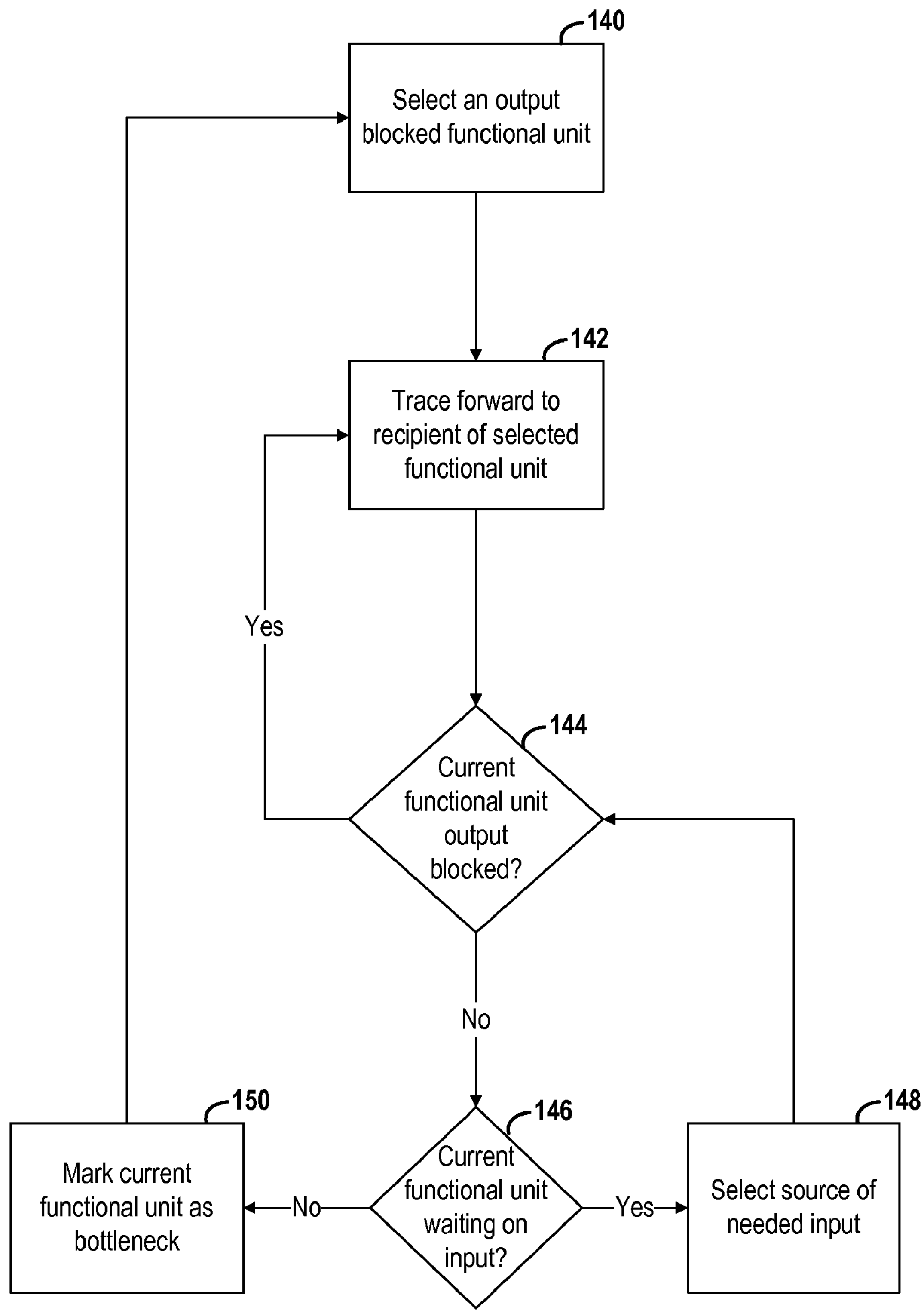
FIG. 1B shows a flow chart of a process for identifying and marking problem functional units in a design, in accordance with various embodiment of the invention.

FIG. 1B shows a flow chart of a process for identifying and marking problem functional units in a design for a PLD, in accordance with various embodiments of the invention. In a specific instance, the process of steps 140 to 150 may be implemented to perform one implementation of the aforementioned tracing aspects of step 110 of FIG. 1A.

At step 140, a functional unit that has been identified as a problem functional unit according to step 110 of FIG. 1A, is selected as the current functional unit.

At step 142, a tracing step is implemented to select a functional unit that receives the output of the current unit via a queue which was output blocked. This selected functional unit is then set as the current functional unit. In some instances there may be more than one functional unit that receives the output of the current block. In such instances, the process can implement parallel or sequential traces to these additional functional units to determine which path(s) contain problematic functional units.

At step 144, a determination is made as to whether or not the current functional unit was output blocked during the same interval as the source block from which the tracing process arrived. If the current functional unit was output blocked during any such interval, the process proceeds to step 142 to find the next functional unit in the trace. If the current functional unit was not output blocked during any such interval the process proceeds to step 146.

At step 146, a determination is made as to whether or not the current functional unit was waiting on an input from another block (e.g., was input starved) during the same interval as the source block from which the tracing process arrived. If the determination is positive, then the current functional unit is likely not the underlying problem and the process will proceed to step 148. If the determination is that the current functional unit was not waiting on an input from another block during this interval, then the process proceeds to step 150.

At step 148, the functional unit that is providing the source of the required input (i.e., the input being waited on as determined in step 146) is selected and set to the current functional unit. The process then proceeds to step 144.

At step 150, the current functional unit is marked for optimization as it is a likely cause of output blockage within the design. The process can then proceed to step 140 until such a time as an exit criteria is met, such as the exhaustion of functional units with blocked outputs or a limit on the number of functional units to modify per execution and analysis cycle has been met. Any block traversed during steps 142/144 may be removed from the set under consideration in step 140.

It should be noted that there may be multiple intervals of output blocked and/or input starved conditions for each functional unit traced in steps 140-148. For the sake of identification of the likely underlying cause of output blockage within the design, the tracing process attempts to find a contiguous chain of functional units which were concurrently in the output blocked or input starved (depending on their position in the trace) condition. It should be further noted that due to the latency of execution of each functional unit that the time intervals may not match exactly. Thus the tracing process may allow for a certain percentage of deviation in time when considering the overlap.

The trace steps of FIG. 1B show one example of a specific method of finding a functional unit to be marked for optimization. The process may be implemented by first determining functional units that have full input queues and tracing to the problem functional units from those full input queue functional units. In another example, potential problem functional units may be identified by monitoring the status of the input and/or output queues of the functional units. Functional units that have a higher average of tokens in their queues (this average can be measured as a ratio of average number of tokens in the queue to the average number of tokens consumed per action firing) may be marked as likely bottlenecks for the design.

Figure 2:
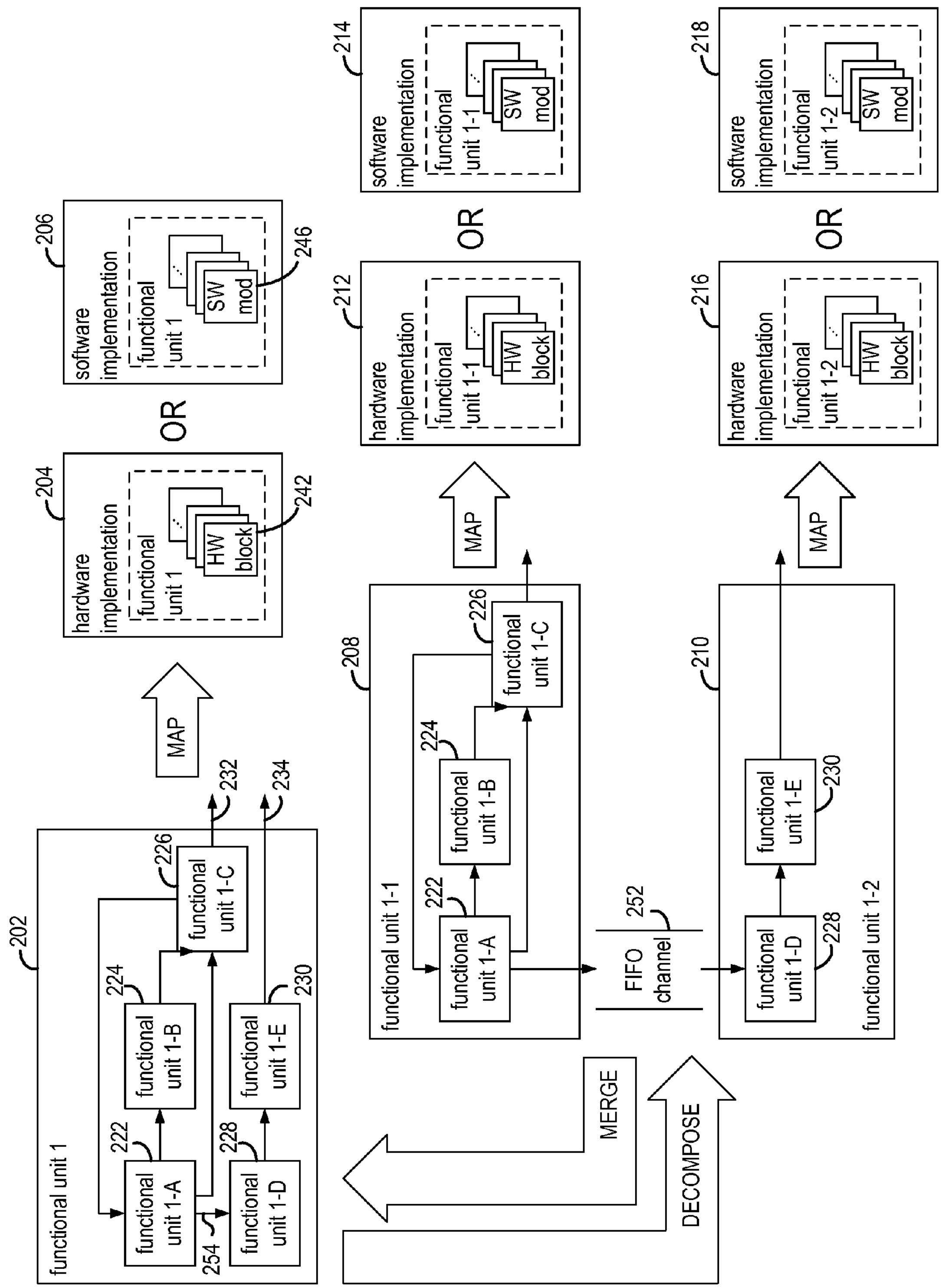
FIG. 2 is an example flow diagram that shows the mapping of a functional unit to an implementation, along with a decomposition or composition and a remapping in accordance with various embodiments of the invention.

FIG. 2 is an example flow diagram that shows the mapping of a functional unit to an implementation, along with a decomposition or composition and a remapping in accordance with various embodiments of the invention. Functional unit 202 is shown as being mapped to a hardware implementation 204 or a software implementation 206.

In the process of identifying a problem functional unit, selecting a functional unit to optimize, and updating the design (FIG. 1, steps 110, 116, and 118), a functional unit may be decomposed into two or more functional units or two or more functional units may be merged into a single functional unit. In FIG. 2, functional unit 202 is shown as having been decomposed into functional units 208 and 210. FIG. 2 also illustrates the scenario of merging of functional units 208 and 210 into functional unit 202. Functional unit 208 is mapped to either hardware implementation 212 or software implementation 214. Functional unit 210 is mapped to either hardware implementation 216 or software implementation 218.

Functional unit 202 includes functional units 222, 224, 226, 228, and 230, with functional units 226 and 230 providing the output from functional unit 202 shown as lines 232 and 234. While not shown, it will be recognized that for functional unit 1 to couple to another functional unit(s) via output lines 232 and 234, the output lines would be coupled to respective FIFO channels/queues, and the other functional unit(s) would read from those FIFO channels.

The functional unit 202, along with the included functional units 222, 224, 226, 228, and 230 are mapped to either a hardware implementation 204 or a software implementation 206. The hardware implementation 204 includes one or more hardware blocks 242 which collectively represent a mapping of the specification of functional unit 202 to specific hardware resources, such as those of a PLD. The software implementation 206 includes one or more software modules 246 which collectively represent a mapping of the specification of functional unit 202 to software that would execute on a particular processor of the designers choosing.

Functional units 208 and 210 are formed from decomposing functional unit 202, and a FIFO channel 252 is added to implement the connection from functional unit 208 to functional unit 210. It will be recognized that the FIFO channel 252 corresponds to line 254 in functional unit 202. The example decomposition creates functional unit 208 to include functional units 222, 224, and 226 of functional unit 202 and creates functional unit 210 to include functional units 228 and 230 of functional unit 202. Each of functional units 208 and 210 is separately mapped. That is, functional unit 208 is mapped to either hardware implementation 212 or software implementation 214, and functional unit 210 is mapped to either hardware implementation 216 or software implementation 218. For example, depending on the optimization objectives both functional units 208 and 210 may be implemented as hardware (212 and 216), one may be hardware and the other software (212 and 218, or 214 and 216), or both may be software (214 and 218).

Figure 3:
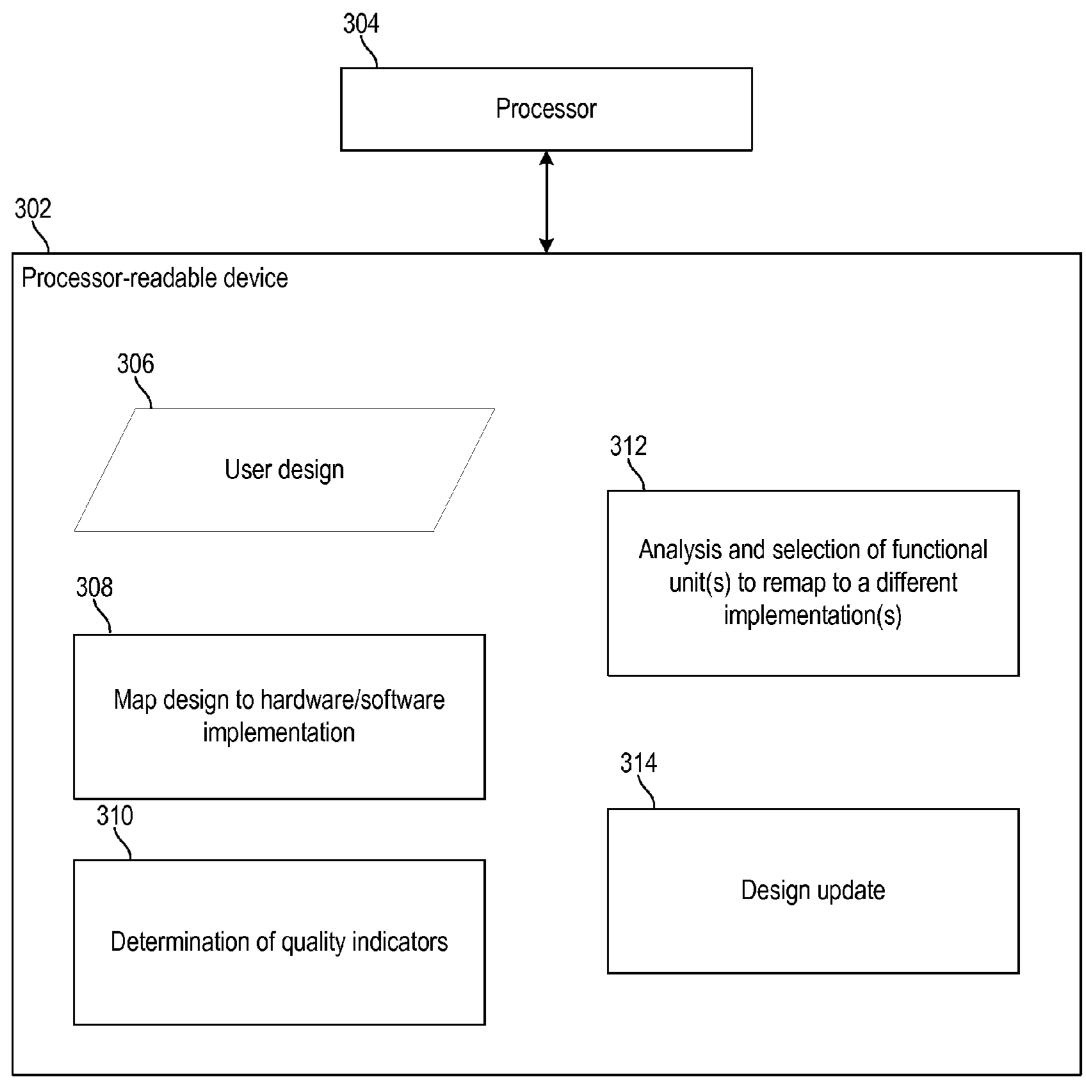
FIG. 3 is a diagram of a processor and machine readable memory in accordance with various embodiments of the invention.

FIG. 3 is a diagram of a processor and machine readable memory in accordance with various embodiments of the invention. Processor 304 implements the functions shown in blocks 306-314, which are represented as software that is stored in processor-readable device 302. More specifically, block 306 represents the user's design. Block 308 represents software for mapping the functional units of the user's design 308 to specific implementations, including, for example, hardware, software, or a combination of both hardware and software.

Block 310 represents software that determines quality indicators of the mapped functional units based on a certain mapping. Such determination may be made based on an execution trace of the functional units as described above. The software of block 312 analyzes the execution trace and/or performs a static analysis of the user design 306 to select one or more of the functional units for re-implementing and remapping. The design update software 314 changes the user design 306 based on the selected functional units selected for reimplementation. As described above, for example, the re-implementing may change a functional unit from hardware to software, from software to hardware, from a single functional unit into multiple functional units or from multiple functional units into a single functional unit.

Figure 4:
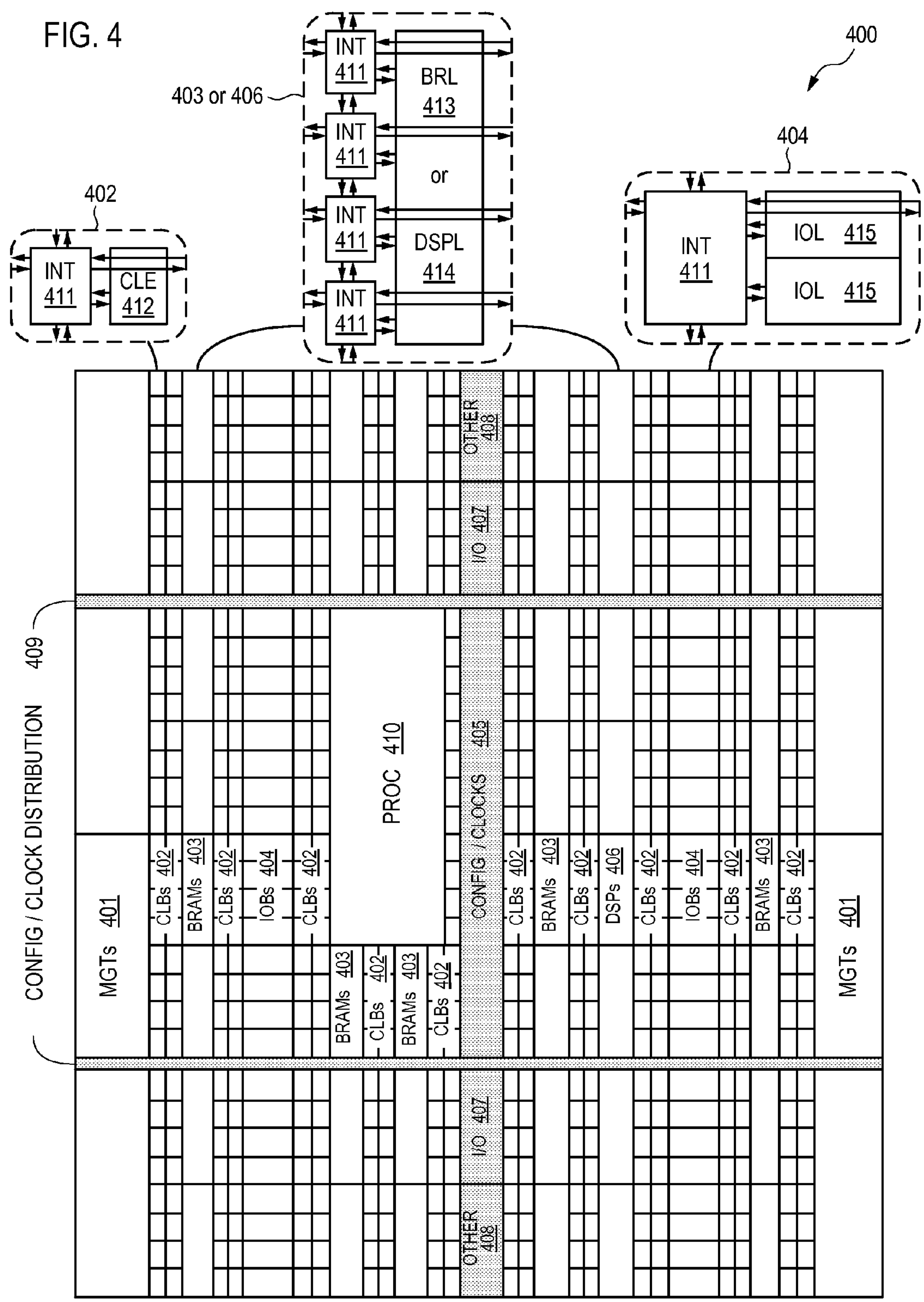
FIG. 4 is a block diagram that illustrates an example field programmable gate array (FPGA) on which (or for which) an embodiment of the invention may be implemented.

FIG. 4 is a block diagram that illustrates an example field programmable gate array (FPGA) on which (or for which) an embodiment of the invention may be implemented. Certain PLDs, such as advanced field programmable gate arrays (FPGAs) can include several different types of programmable logic blocks in the array. FIG. 4 illustrates an example FPGA architecture 410 that includes a large number of different programmable tiles including multi-gigabit transceivers (MGTs 411), configurable logic blocks (CLBs 412), random access memory blocks (BRAMs 413), input/output blocks (IOBs 414), configuration and clocking logic (CONFIG/CLOCKS 415), digital signal processing blocks (DSPs 416), specialized input/output blocks (I/O 417) (e.g., configuration ports and clock ports), and other programmable logic 418 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 412 can include a configurable logic element (CLE 412) that can be programmed to implement user logic plus a single programmable interconnect element (INT 411). A BRAM 413 can include a BRAM logic element (BRL 413) in addition to one or more programmable interconnect elements. Frequently, the number of interconnect elements included in a tile depends on the height of the tile. In the pictured embodiment, a BRAM tile has the same height as four CLBs, but other numbers (e.g., five) can also be used. A DSP tile 416 can include a DSP logic element (DSPL 414) in addition to an appropriate number of programmable interconnect elements. An 10B 414 can include, for example, two instances of an input/output logic element (IOL 415) in addition to one instance of the programmable interconnect element (INT 411). As will be clear to those of skill in the art, the actual I/O pads connected, for example, to the I/O logic element 415 are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 419 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

Figure 5:
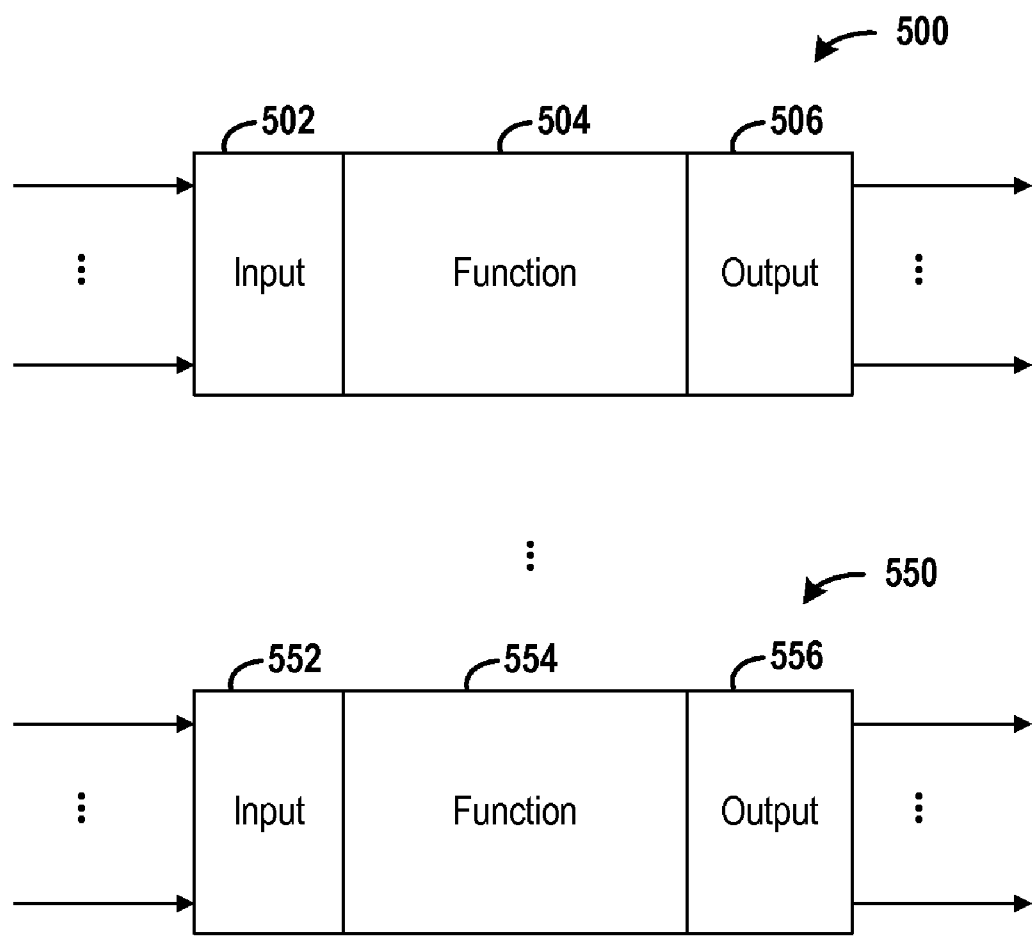
FIG. 5 is a block diagram that illustrates an example of user-definable blocks implemented for use in an embodiment of the invention.

FIG. 5 is a block diagram that illustrates an example of functional units implemented for use in an embodiment of the invention. According to a specific embodiment, the functional units 500 to 550 are implemented as actors such as with the CAL language. At a basic level an actor can be thought of as a functional unit that performs a function or computation on a sequence of tokens (data) that are received and that produces a corresponding sequence of tokens as an output. For example, the actor that implements functional unit 500 performs function 504, and the actor that implements function unit 550 performs function 554. Several actors can be arranged together to form a network of interconnected actors. For example, the outputs 506, 556 and inputs 502, 552 of actors 500 and 550 can be connected to other actors. Generally, each interconnection is a unidirectional connection that allows data to flow from an output of one actor to an input of another actor.

The functionality and structure of the various actors can be implemented using a variety of different parameters. For example, the outputs 506, 556 and inputs 502, 552 are implemented as FIFO queues to hold the tokens. A FIFO queue implements the connection between the output of one actor and the input of another actor. For example, if the output 506 of the actor that implements functional unit 500 were connected another actor (not shown), the input of that other actor and output 506 would be implemented with a FIFO queue. It is also possible for each actor to have one or more inputs (and also one or more outputs). In another instance, an actor can consume and produce more than a single token at a time. It may also require multiple tokens to be present before the function 504, 554 is carried out. In yet another instance, the function 504, 554 may vary depending upon the input parameters, the current state of the actor, or other, similar parameters.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable storage media or delivery channels such as magnetic or optical disks or tapes, electronic storage devices, or as application services over a network.

Although the present invention has been described with respect to certain specific embodiments, it will be clear to those skilled in the art that the inventive features of the present invention are applicable to other embodiments as well, all of which are intended to fall within the scope of the present invention. For example, various additional factors may be applied to the determination of whether a functional unit is problematic, additional metrics of quality may be specified, additional optimizations may be specified in the optimization series applied, loop unrolling and other techniques for logic transformation may be used, and various target architectures may be mapped to.

What is claimed is:

1. A method for mapping an electronic design specification to an implementation, the design specification including a plurality of functional units, the method comprising:

associating a quality metric with one or more of the functional units;

mapping, by a processor, each functional unit to a respective initial implementation;

determining for each functional unit based on the mapping, a respective quality indicator that specifies a degree to which the functional unit achieves the associated quality metric;

selecting at least one of the functional units for remapping based on at least one of the quality indicator of that functional unit or the quality indicator of another functional unit;

selecting an alternative implementation to the initial implementation for each selected functional unit to improve the quality indicator, wherein the alternative implementation is selected from at least one hardware-type implementation and at least one software-type implementation; and remapping the selected functional unit to the selected alternative implementation, wherein the at least one of the functional units selected for remapping is a functional unit having a quality indicator that fails to meet a threshold.

2. The method of claim 1, further comprising:

wherein the determining the respective quality indicator includes, executing the functional units based on the mapping, during execution and in response to an executing functional unit being output blocked, storing data indicative of the functional unit being output blocked, and during execution and in response to an executing functional unit being input blocked, storing data indicative of the functional unit being input blocked; wherein the selecting at least one of the functional units for remapping includes, determining for each output blocked functional unit, a subset of the plurality of functional units that caused the functional unit to be indicated as output blocked, and wherein the at least one of the functional units selected for remapping includes a functional unit of the subset that is indicated as being input blocked.

3. The method of claim 2, wherein the selecting at least one of the functional units for remapping includes:

determining a priority order of the functional units based on respective degrees to which the functional units achieve the associated quality metric, and selecting the at least one of the functional units based on the priority order.

4. The method of claim 1, further comprising:

wherein the determining the respective quality indicator includes, determining respective concurrency factors of two or more of the functional units; and wherein the at least one of the functional units selected for remapping is selected based on the concurrency factors.

5. The method of claim 1, wherein the determining the respective quality indicator comprises:

executing the functional units based on the mapping, and during execution, storing time-annotated trace information indicative of the quality metric of the functional units.

6. The method of claim 1, further comprising:

wherein each connection specified between the functional units in the electronic design specification is a respective first-in-first-out channel;

decomposing a first of the selected at least one functional unit into at least two functional units with a respective first-in-first-out channel coupling the at least two functional units;

wherein the selecting an alternative implementation includes selecting a corresponding implementation for each of the at least two functional units and the respective first-in-first-out channel; and wherein the remapping includes mapping the at least two functional units and the respective first-in-first-out channel to the corresponding implementations.

7. The method of claim 6, wherein the initial implementation of the first of the selected at least one functional unit is a software-type implementation and the corresponding implementation of at least one of the at least two functional units is a hardware implementation.

8. The method of claim 1, further comprising:

wherein each connection specified between the functional units in the electronic design specification is a respective first-in-first-out channel;

wherein the at least one selected functional unit includes first and second functional units;

merging the first and second functional units into a single functional unit;

wherein the selecting an alternative implementation includes selecting a corresponding implementation for the single functional unit; and wherein the remapping includes mapping the single functional unit to the corresponding implementation.

9. The method of claim 8, wherein the respective initial implementations of the first and second functional units are hardware implementations, and the corresponding implementation of the single functional unit is a software-type implementation.

10. The method of claim 1, wherein the respective initial implementations are with programmable logic resources.

11. The method of claim 1, wherein the respective initial implementations are with software-type implementations.

12. The method of claim 1, wherein the respective initial implementations are with programmable logic resources and with software-type implementations.

13. The method of claim 1, further comprising:

wherein each connection specified between the functional units in the electronic design specification is a respective first-in-first-out channel;

wherein the at least one selected functional unit includes first and second functional units;

translating the first and second functional units into software that specifies a single thread and with the first-in-first-out channel between the first and second functional units implemented as a memory object;

wherein the remapping includes mapping the software that specifies the single thread to a processor.

14. The method of claim 1, further comprising:

wherein each connection specified between the functional units in the electronic design specification is a respective first-in-first-out channel;

wherein the at least one selected functional unit includes first and second functional units;

translating the first and second functional units into software that specifies respective threads and with the first-in-first-out channel between the first and second functional units implemented as a memory object;

wherein the remapping includes mapping the software that specifies the respective threads to a processor.

15. The method of claim 1, further comprising:

wherein the determining the respective quality indicator includes, executing the functional units based on the mapping, during execution and in response to an executing functional unit being output blocked, storing data indicative of the functional unit being output blocked, and during execution and in response to an executing functional unit being input blocked from inputting data, storing data indicative of the functional unit being input blocked; and wherein the selecting at least one of the functional units for remapping includes, determining for each output blocked functional unit, a subset of the plurality of functional units that caused the functional unit to be indicated as output blocked, and wherein the at least one of the functional units selected for remapping is a functional unit of the subset that is indicated as being input blocked; and wherein the selected alternative implementation is a hardware implementation.

16. An article of manufacture, comprising:

a non-transitory processor-readable medium configured with instructions for mapping an electronic design specification to an implementation, wherein the design specification includes a plurality of functional units and the processor in executing the instructions performs the operations including:

associating a quality metric with one or more of the functional units;

mapping each functional unit to a respective initial implementation;

determining for each functional unit based on the mapping, a respective quality indicator that specifies a degree to which the functional unit achieves the associated quality metric;

selecting at least one of the functional units for remapping based on at least one of the quality indicator of that functional unit or the quality indicator of another functional unit;

selecting an alternative implementation to the initial implementation for each selected functional unit to improve the quality indicator, wherein the alternative implementation is selected from at least one hardware-type implementation and at least one software-type implementation; and remapping the selected functional unit to the selected alternative implementation, wherein the at least one of the functional units selected for remapping is a functional unit having a quality indicator that fails to meet a threshold.

17. The article of manufacture of claim 16, wherein the determining the respective quality indicator includes:

executing the functional units based on the mapping;

during execution and in response to an executing functional unit being output blocked, storing data indicative of the functional unit being output blocked; and during execution and in response to an executing functional unit being input blocked, storing data indicative of the functional unit being input blocked; and wherein the selecting at least one of the functional units for remapping includes:

determining for each output blocked functional unit, a subset of the plurality of functional units that caused the functional unit to be indicated as output blocked; and wherein the at least one of the functional units selected for remapping is a functional unit of the subset that is indicated as being input blocked.

18. The article of manufacture of claim 16, wherein the selecting at least one of the functional units for remapping includes:

determining a priority order of the functional units based on respective degrees to which the functional units achieve the associated quality metric, and selecting the at least one of the functional units based on the priority order.

* * * * *